(12) United States Patent
Vu

(10) Patent No.: US 6,717,446 B1
(45) Date of Patent: Apr. 6, 2004

(54) HIGH SPEED PROGRAMMABLE CHARGE-PUMP WITH LOW CHARGE INJECTION

(75) Inventor: Ha Chu Vu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/244,724

(22) Filed: Sep. 16, 2002

(51) Int. Cl.[7] .................................................. H03L 7/06
(52) U.S. Cl. ...................... 327/157; 327/148; 375/374
(58) Field of Search ................................. 327/147–150, 327/154–159, 161, 536, 537; 331/17, 14, DIG. 2; 375/373–376

(56) References Cited

U.S. PATENT DOCUMENTS

| | | | | |
|---|---|---|---|---|
| 5,173,664 A | * | 12/1992 | Petersen et al. ............ 331/1 A |
| 5,886,551 A | * | 3/1999 | Narahara .................... 327/157 |
| 6,011,822 A | * | 1/2000 | Dreyer ........................ 375/376 |
| 6,415,007 B1 | * | 7/2002 | Kawasumi .................. 375/374 |
| 6,441,660 B1 | * | 8/2002 | Ingino, Jr. .................. 327/156 |

OTHER PUBLICATIONS

Rhee, et al. A 1.1–GHz CMOS Fractional–N Frequency Synthesizer with a 3–b Third–Order ΔΣ Modulator, *IEEE Journal of Solid–State Circuits, vol. 35, No. 10, Oct. 2000*, pp. 1453–1460.

* cited by examiner

*Primary Examiner*—Minh Nguyen
(74) *Attorney, Agent, or Firm*—Brett A. Hertzberg; Merchant & Gould, P.C.

(57) ABSTRACT

A high-speed charge-pump circuit includes an array of current source/sinks circuits that are selectable according to UP and DOWN control signals, and a programmable setting. Each current source/sink circuit includes a current source circuit and a current sink circuit. The current source and current sink circuits are coupled to cascode circuits to minimize charge feed-through at the output of the charge-pump circuit. Matched switching circuits are configured to absorb charges that are injected at a common node between the cascode circuits and the current source/sink circuits. A clamp adjustment circuit is arranged to provide clamp voltages to the common node when the current source/sink circuits are in an off mode such that switching speeds are improved. The reduced switching-times permit the charge-pump to operate at high speeds.

16 Claims, 5 Drawing Sheets

HIGH SPEED PROGRAMMABLE CHARGE-PUMP WITH LOW CHARGE INJECTION

FIELD OF THE INVENTION

The present invention is generally related to a programmable charge-pump circuit. More particularly, the present invention is related to a charge-pump circuit with reduced charge injection characteristics from switching at the output of the charge-pump circuit, and reduced slewing in the charge-pump such that high speed operation is possible.

BACKGROUND OF THE INVENTION

Phase-locked loop (PLL) circuits are useful in many electronic systems. Applications for PLL circuits include master clock generation for a microprocessor system, clock generation for a sampling clock in an analog-to-digital converter system, clock generation for data recovery in a low-voltage differential (LVDS) driver/receiver system, clock generation for video systems, as well as others.

PLL applications typically provide an output clock signal by comparing the output clock signal to a reference clock signal. A phase-detector is often employed to compare the clock signals and provide a raw control signal to a loop filter. The loop filter is most commonly a low-pass filter (LPF) that is arranged to smoothed or averaged control signal in response to the raw unfiltered control signal. A voltage controlled oscillator (VCO) is often arranged to provide the output clock signal in response to the filtered control signal such that the output clock signal is locked in phase with the reference clock signal.

One example PLL circuit includes a phase detector that provides an UP and DOWN signal to a charge-pump circuit in response to the comparison between the output clock signal and the reference clock signal. The UP signal is active when the phase of the output clock is lagging behind the phase of the reference clock, while the DOWN signal is active when the phase of the output clock is leading the phase of the reference clock signal. The UP and DOWN signals are inactive when the phase of the output clock signal and the phase of the input clock signal are matched. The UP and DOWN signals activate a charging and discharging cycle in the charge-pump, where the output current from the charge-pump circuit is integrated on a capacitive type of load.

SUMMARY OF THE INVENTION

Briefly stated, a high-speed charge-pump circuit includes an array of current source/sinks circuits that are selectable according to UP and DOWN control signals, and a programmable setting. Each current source/sink circuit includes a current source circuit and a current sink circuit. The current source and current sink circuits are coupled to cascode circuits to minimize charge feed-through at the output of the charge-pump circuit. Matched switching circuits are configured to absorb charges that are injected at a common node between the cascode circuits and the current source/sink circuits. A clamp adjustment circuit is arranged to provide clamp voltages to the common node when the current source/sink circuits are in an off mode such that switching speeds are improved. The reduced switching-times permit the charge-pump circuit to operate at high speeds.

According to a feature of the invention, a programmable charge-pump circuit provides an output signal to an output node in response to UP and DOWN signals. The programmable charge-pump circuit includes a charge pump decoder circuit, an array of selectable current sources, and an array of selectable current sinks. The charge-pump decoder circuit is arranged to provide a first array of control signals in response to the UP signal and a program control signal. The charge-pump decoder circuit also provides a second array of control signals in response to the DOWN signal and the program control signal. The program signal determines which of the first and second array of control signals are selected in response to the UP and DOWN signals, respectively, such that the non-selected control signals from the first and second arrays are maintained at a constant logic level. Each of the selectable current sources includes a current source circuit that is selectively coupled to the output node through a corresponding cascode circuit when activated in response to a corresponding DOWN control signal from the first array of control signals. Each of the selectable current sinks includes a current sink circuit that is selectively coupled to the output node through another corresponding cascode circuit when activated in response to a corresponding UP control signal from the second array of control signals. By maintaining constant logic levels on the control signals for the non-selected current source and sink circuits, charge feed-through to the output node is minimized.

The present invention is also related to phase-locked-loop systems. An example phase-locked-loop system that is in accordance with the present invention may include a phase-detector circuit, a charge-pump circuit, a loop filter circuit, a current controlled oscillator circuit, and a counter circuit. The charge-pump circuit includes a charge-pump decoder circuit, an array of selectable current sources, and an array of selectable current sinks. The phase-detector circuit provides an UP signal and a DOWN signal by comparing an input signal phase to a clock signal phase. The charge-pump decoder circuit is arranged to provide a first array of control signals in response to the UP signal and a program control signal. The charge-pump decoder circuit also provides a second array of control signals in response to the DOWN signal and the program control signal. The program signal determines which of the first and second array of control signals are selected in response to the UP and DOWN signals, respectively, such that the non-selected control signals from the first and second arrays are maintained at a constant logic level. Each of the selectable current sources includes a current source circuit that is selectively coupled to the output node through a corresponding cascode circuit when activated in response to a corresponding DOWN control signal from the first array of control signals. Each of the selectable current sinks includes a current sink circuit that is selectively coupled to the output node through another corresponding cascode circuit when activated in response to a corresponding UP control signal from the second array of control signals. The loop filter circuit is coupled to the output node, wherein the loop filter is arranged to integrate current that is provided to the output node. The current-controlled oscillator circuit is coupled to an output of the loop filter circuit The counter circuit is coupled to an output of the current-controlled oscillator circuit, and configured to provide the clock signal. By maintaining constant logic levels on the control signals for the non-selected current source and sink circuits in the charge-pump circuit, charge feed-through to the output node is minimized.

According to another feature of the invention, a programmable charge-pump circuit provides an output signal to an output node in response to an UP signal, a DOWN signal, and a program signal. The programmable charge-pump circuit includes a means for decoding, first and second means for sourcing current, first and second means for enabling, first and second means for cascoding, and first and second means for disabling. The means for decoding is responsive to the program control signal, the UP signal, and the DOWN signal. The means for decoding is arranged to provide a first array of control signals in response to the UP signal and the program control signal, and also provide a second array of control signals in response to the DOWN signal and the program control signal. The program signal determines which of the first and second array of control signals are selected in response to the UP and DOWN signals, respectively, such that the non-selected control signals from the first and second arrays are maintained at constant logic levels. The first means for sourcing current is arranged to provide a first source current when active. The first means for enabling is arranged to selectively activate the first means for sourcing current in response to a corresponding one of the second array of control signals. The first means for cascoding is arranged to cascode the means for sourcing current when the first means for enabling activates the means for sourcing. The first means for cascoding is further arranged to provide the first source current to the output node when active. The first means for disabling is arranged to deactivate the first means for cascoding in response to an inverse of the corresponding one of the second array of control signals. The second means for sourcing current is arranged to provide a second source current when active. The second means for enabling is arranged to selectively activate the second means for sourcing current in response to a corresponding one of the first array of control signals. The second means for cascoding that is arranged to cascode the second means for sourcing current when the second means for enabling activates the second means for sourcing. The second means for cascoding is further arranged to drain the second source current from the output node when active. The second means for disabling is arranged to deactivate the second means for cascoding in response to an inverse of the corresponding one of the first array of control signals.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediate devices. The term "coupled" means either a direct electrical connection between the things that are connected, or an indirect connection through one or more passive or active intermediary devices. The term "circuit" means either a single component or a multiplicity of components, either active or passive, that are coupled together to provide a desired function.

The present invention relates to programmable charge-pump circuits that are used in high-speed PLL systems. The charge-pump circuit operates at high frequencies by minimizing charge leakage through the current source while maintaining low charge (or clock) feed-through errors. The programmable charge-pump circuit includes an array of current source/sink circuits that are selectively activated or deactivated to change the charging time for use in the PLL application. By only clocking the active current source/sink circuits, charge leakage from deactivated current sources is eliminated. Transistors that receive complementary clocks are used to clock the current sources such that fast turn-on and turn-off times are achieved. Slewing time is improved by a clamp adjustment circuit that is arranged to clamp the sources of transistors that are in an off mode to reduce the turn-on time associated with those transistors. Current sources are cascoded to reduce clock feed-through. On chip capacitors are arranged to absorb charges such that stray charges are not transferred to the output node of the charge-pump circuit.

The above-described features, as well as others, will be described below with reference to the accompanying drawings.

Operating Environment

Figure 1:
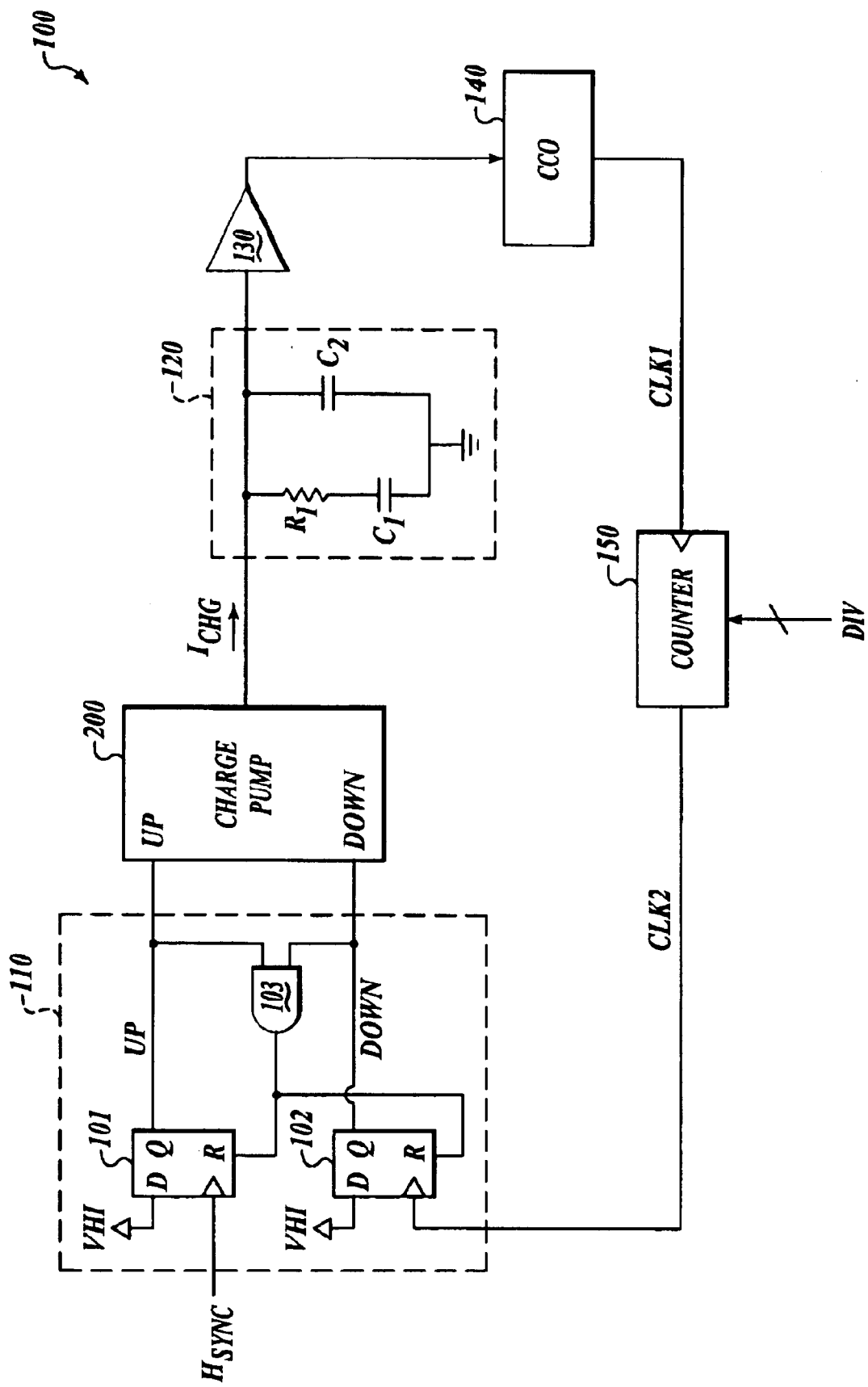
FIG. 1 is a schematic diagram of an operating environment for a charge-pump circuit.

FIG. 1 is a schematic diagram (100) of an exemplary operating environment for a charge-pump circuit that is arranged in accordance with the present invention. The schematic diagram (100) includes a phase-detector circuit (110), a charge-pump circuit (200), a loop filter circuit (120), a buffer circuit (130), current-controlled current oscillator (140), and a counter circuit (150). The charge-pump circuit (200) illustrated in FIG. 1 is a part of a clock synthesizer circuit. The clock synthesizer circuit provides a clock output (CLK1), which is generated as a multiple of the input reference clock (HSYNC). The relationship between the frequency of the input reference clock (fclk_in) and the output clock frequency (fclk_out) is given by: fclk_out= N*fclk_in, where N is an integer that corresponds to a divider ratio.

The phase-detector circuit (110) includes two flip-flop circuits (101, 102), and an AND logic circuit (103). Flip-flop circuit 101 includes a D input that is coupled to VHI, a clock input that receives an input signal (HSYNC), a Q output that provides the UP signal, and a reset signal that is coupled to the output of AND logic circuit 103. Flip-flop circuit 102 includes a D input that is coupled to VHI, a clock input that receives a divided clock signal (CLK2), a Q output that provides the DOWN signal, and a reset signal that is coupled to the output of AND logic circuit 103. The AND logic circuit has an input that receives the UP signal and another input that receive the DOWN signal such that flip-flop circuits 101 and 102 are reset whenever the UP and DOWN signal are both logic 1. The UP signal changes to a logic 1 when the DOWN signal is logic 0 and the HSYNC signal changes from logic 0 to logic 1. The DOWN signal changes to a logic 1 when the UP signal is logic 0 and the CLK2 signal changes from logic 0 to logic 1. When HSYNC and CLK2 are in phase with one another, the UP and DOWN signal are both in a logic 0 condition.

The charge-pump circuit provides an output current (ICHG) in response to the UP and DOWN signals. The output current has a negative polarity when the UP signal is active, and a positive polarity when the DOWN signal is active. The loop filter receives the output current and integrates the current. An example loop filter circuit (120) includes a resistor (R1), and two capacitors (C1, C2). Resistor R1 is connected in series with the capacitor C1, which is connected in parallel with the capacitor C2. Resistor R1 and capacitor C1 form a low pass filter, while capacitor C2 provides additional filtering/averaging of the output current. The loop filter averages the output current to provide an average signal that is received by buffer circuit 130.

Buffer circuit 130 provides an output current to the current-controlled oscillator (CCO 140) in response to the average signal. CCO 140 provides an output clock signal (CLK1) in response to the output current, which is received by counter circuit 150. Counter circuit 150 divides the frequency of output clock signal CLK1 according to a divider-ratio that is determined by a control signal (DIV). Divided clock signal CLK2 is provided by counter circuit 150 in response to output clock signal CLK1 and control signal DIV. Counter circuit 150 is configured as a divide-by-N circuit.

Exemplary Charge-pump Circuit

Figure 2:
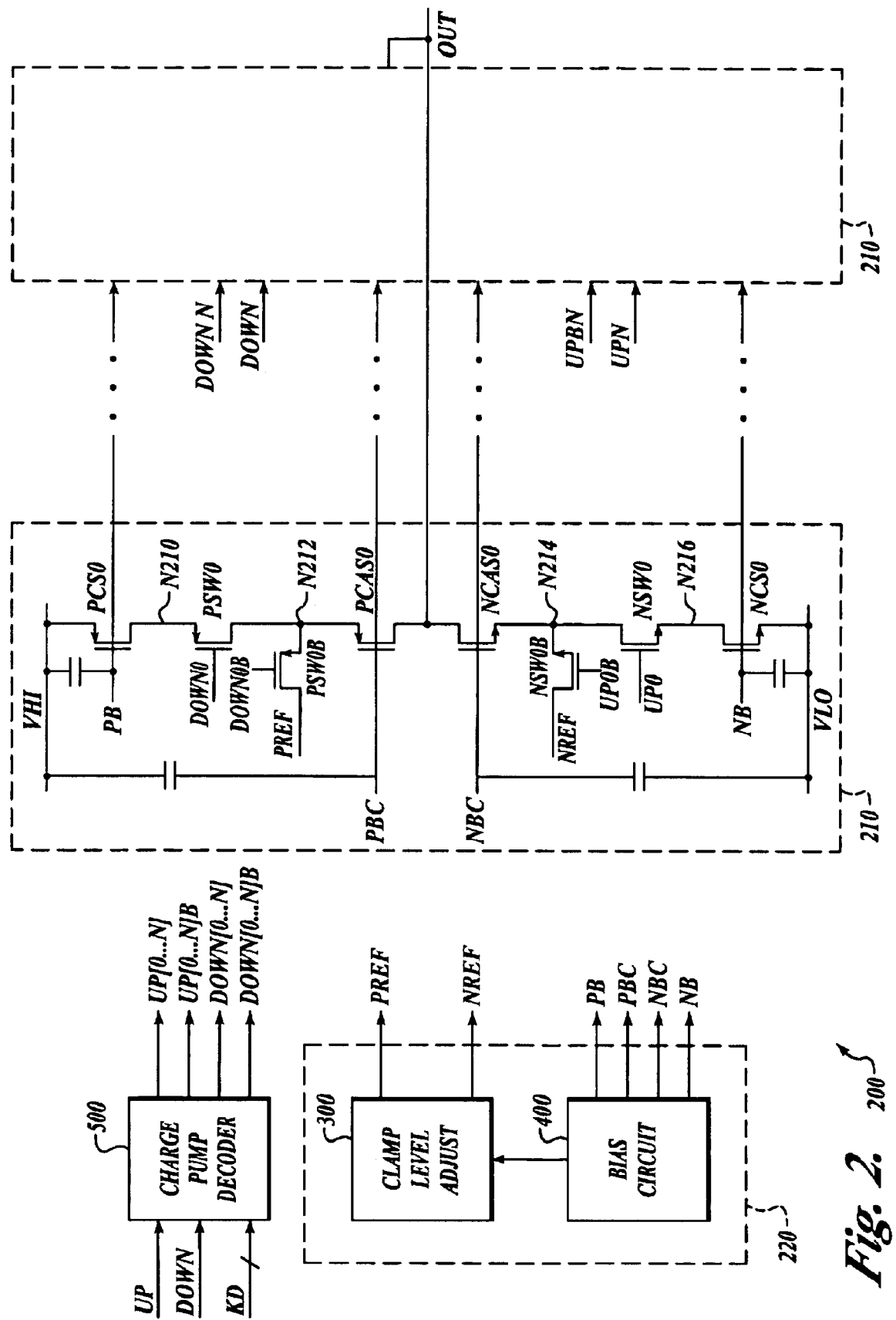
FIG. 2 is a schematic diagram of an exemplary charge-pump circuit.

FIG. 2 is a schematic diagram of an exemplary charge-pump circuit (200) that is arranged in accordance with the present invention. The charge-pump circuit includes an array of selectable current source/sink circuits (210), a clamp level adjustment circuit (300), a bias circuit (400), and a charge-pump decoder circuit (500). In one example, the functions of bias circuit 400 and the clamp level adjustment circuit 300 are combined into a single functional block as illustrated by block 220.

Each of the selectable current source/sink circuits (210) is selectively activated to source and sink current in response to corresponding UP and DOWN signals. For example, a first of the selectable current source/sink circuits (210) is activated in response to signals UP0, UP0B, DOWN0, and DOWN0B, while the $N^{th}$ selectable current source/sink circuit (210) is activated in response UPN, UPNB, DOWNN, and DOWNNB. Each selectable current source/sink circuit 210 includes a selectable current source circuit, which comprises a p-type current source (e.g., transistor PCS0) that is biased by bias signal PB, a p-type switch (e.g., transistor PSW0) that is activated by a signal (e.g. DOWN0), a p-type clamp switch (e.g., transistor PSW0B) that cvated by a DOWNB signal (e.g. DOWN0B), and a p-type cascode circuit (e.g., transistor PCAS0) that is biased by cascode bias signal PBC. Each selectable current source/sink circuit 210 also includes a current sink circuit, which comprises an n-type current source (e.g., transistor NCS0) that is biased by bias signal NB, an n-type switch (e.g., transistor NSW0) that is activated by an UP signal (e.g. UP0), an n-type clamp switch (e.g., transistor NSW0B) that is activated by an UPB signal (e.g. UP0B), and an n-type cascode circuit (e.g., transistor NCAS0) that is biased by cascode bias signal NBC. Each of the bias lines is decoupled by a corresponding capacitor (e.g., capacitors C21–C24) such that charge injection at the output node due to the switching of the current source and sink circuits is minimized.

Each p-type current source (e.g., transistor PCS0) is series coupled to a respective p-type cascode circuit (e.g., transistor PCAS0) when the p-type switch is active (e.g., transistor PSW0). The p-type current source operates as a means for sourcing current. The p-type cascode circuit operates as a means for cascoding the p-type current source. The p-type switch operates as a means for enabling the p-type current source. The output of the p-type cascode circuit is coupled to a common output node (OUT), which operates as the output of the charge-pump circuit (200). The current flows to the common output node from the p-type current source, such that the current is effectively sourced to OUT.

Each n-type current source (e.g., transistor NCS0) is series coupled to a respective n-type cascode circuit (e.g., transistor NCAS0) when the n-type switch is active (e.g., transistor NSW0). The n-type current source operates as another means for sourcing current. The n-type cascode circuit operates as a means for cascoding the n-type current source. The n-type switch operates as a means for, enabling the n-type current source. The output of the n-type cascode circuit is coupled to a common output node (OUT), which operates as the output of the charge-pump circuit (200). The current flows from the common output node through the n-type current source, such that the current is effectively a sinking current with respect to OUT.

A current source circuit is deactivated when the corresponding DOWN signal is logic 1 and the corresponding DOWNB signal is logic 0. A common point (e.g., node N212) between the p-type current source and the p-type cascode circuit is clamped to the PREF signal such that the p-type cascode circuit is quickly deactivated. The turn-on time associated with the p-type cascode circuit is reduced since the clamped voltage limits the difference between operating voltage and the "off" voltage at the common point. A second p-type switch (e.g., transistor PSW0B) is configured to operate as the means for disabling the p-type cascode circuit in response to the corresponding DOWNB signal (e.g., DOWNB0).

A current sink circuit is deactivated when the corresponding UP signal is logic 0 and the corresponding UPB signal is logic 1. A common point (e.g., node N214) between the n-type current source and the n-type cascode circuit (e.g., node N214) is clamped to the NREF signal such the n-type cascode circuit is quickly deactivated. The turn-on time associated with the n-type cascode circuit is reduced since the clamped voltage limits the difference between operating voltage and the "off" voltage at the common point. A second n-type switch (e.g., transistor NSW0B) is configured to operate as the means for disabling the n-type cascode circuit in response to the corresponding UPB signal (e.g., UPB0).

Each pair of switches in the current-source circuit is arranged to minimize charge feed-through to the output node (OUT). For example, transistor PSW0 and PSW0B are identically sized such that the parasitic capacitances associated with those transistors are the same. When the switching transistor is activated (e.g., transistor PSW0) charge is injected into node N212 in response to the DOWN0 signal. Since transistor PSW0B is sized the same as transistor PSW0 and signal DOWN0B is an inverse of signal DOWN0, a similar (or nearly identical) charge is removed from node N212 by transistor PSW0B. Similar charge injections are minimized when the switching transistors are operated in a reverse direction.

Each pair of switches in the current-sink circuit is arranged to minimize charge feed-through to the output node (OUT). For example, transistor NSW0 and NSW0B are identically sized such that the parasitic capacitances associated with those transistors are the same. When the switching transistor is activated (e.g., transistor NSW0) charge is injected into node N214 in response to the UP0 signal. Since transistor NSW0B is sized the same as transistor NSW0 and signal UP0B is an inverse of signal UP0, a similar (or nearly identical) charge is removed from node N214 by transistor NSW0B. Similar charge injections are minimized when the switching transistors are operated in a reverse direction.

Figure 5:
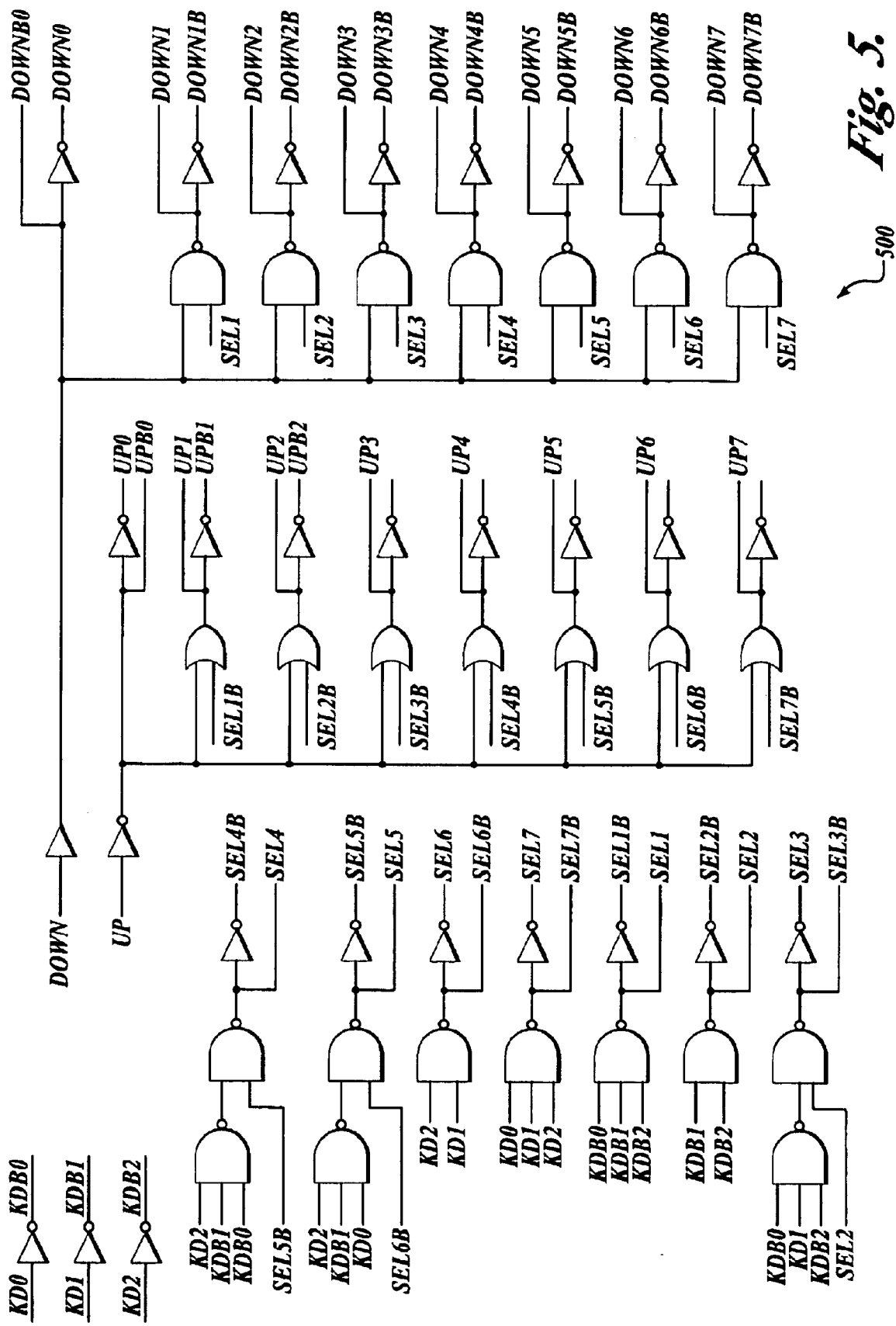
FIG. 5 is a schematic diagram of an exemplary charge-pump decoder circuit that is used to selectively activate the charge-pump circuit that is shown in FIG. 2, in accordance with the present invention.

Clamp level adjustment circuit 300 is arranged to provide the two reference signals (PREF, NREF) in response to one or more bias signals from bias circuit 400. The reference signals are provided to the selectable current sources (210). The PREF signal cooperates with switching transistors in the p-type current source (e.g., transistor PSW0B) of the selectable current source (210) such that the turn-on time associated with the p-type current sources are minimized. Similarly, the NREF signal cooperates with switching transistors in the n-type current source (e.g., transistor NSW0B) of the selectable current source (21) such that the turn-on time associated with the n-type current sources are minimized. An example implementation of clamp level adjustment circuit 300 is illustrated in FIG. 5, as will be described later.

Figure 4:
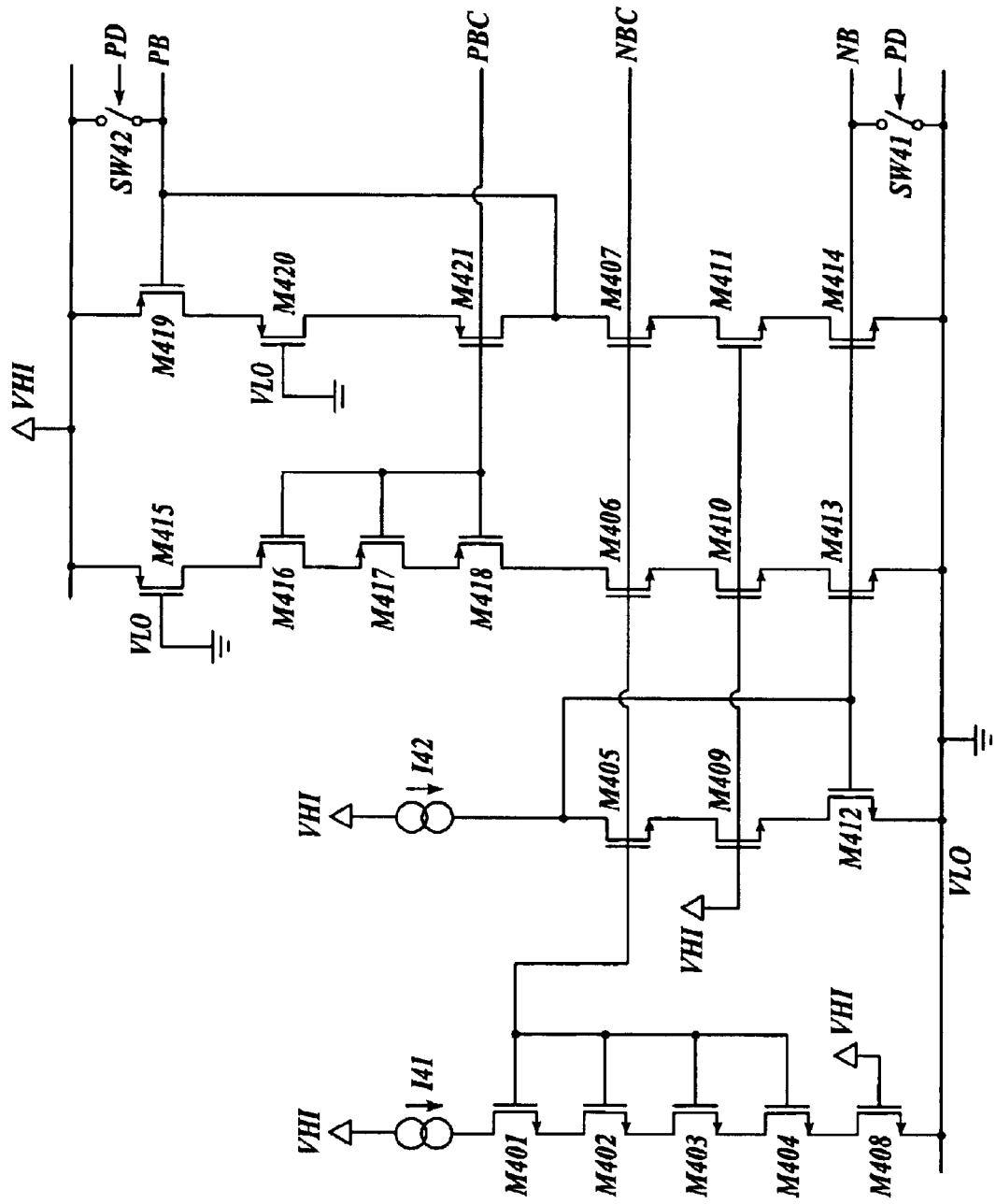
FIG. 4 is a schematic diagram of an exemplary bias circuit that is used to bias the charge-pump circuit that is shown in FIG. 2.

Bias circuit 400 is configured to provide biasing signals for clamp level adjustment circuit 300 and selectable current sources 210. Bias circuit 400 provides bias signals PB, PBC, NB, and NBC. Bias signal PB is provided to bias p-type transistor current sources, while bias signal PBC is provided to bias p-type cascode transistors for each respective current source. Bias signal NB is provided to bias n-type transistor current sources, while bias signal NBC is provided to bias n-type cascode transistors for each respective current source. An example implementation of bias circuit 400 is illustrated in FIG. 4, as will be described later.

Charge-pump decoder circuit 500 is configured to provide control signals UP[0 ... N], UP[0 ... N]B, DOWN[0 ... N], and DOWN[0 ... N]B in response to control signals UP, DOWN, and program control signal KD. The program control signal (KD) is arranged to determine the appropriate number of current source/sink circuits that are activated and deactivated. For example, when all of the current source/sink circuits are enabled, changes in the UP and DOWN signals result in corresponding changes in all of the UP[0 ... N] and DOWN[0 ... N] signals, and their inverse signals (UP[0 ... N]B, and DOWN[0 ... N]B). An exemplary implementation of a charge-pump decoder circuit is illustrated in FIG. 5, as will be described later.

Exemplary Clamp Level Adjustment Circuit

Figure 3:
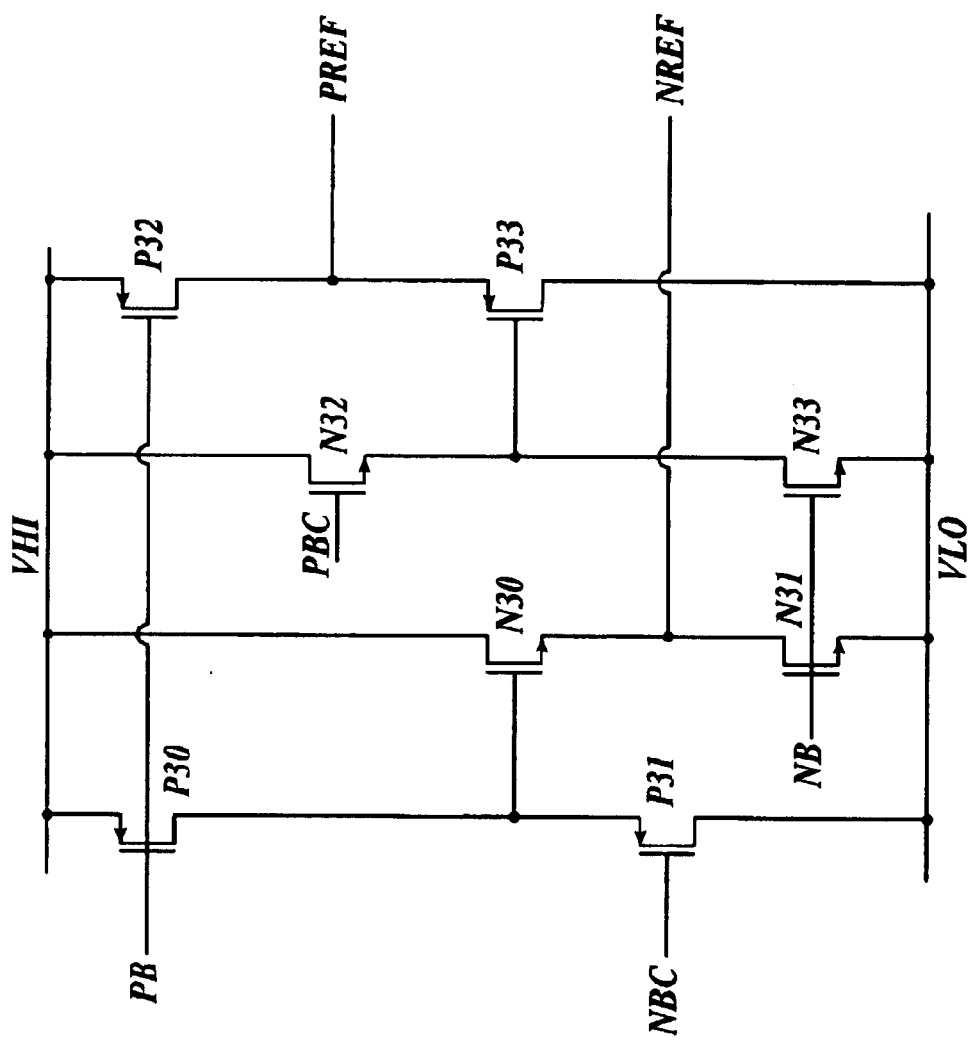
FIG. 3 is a schematic diagram of an exemplary clamp level adjustment circuit that is used to reduce the slewing time of the charge-pump circuit that is shown in FIG. 2.

FIG. 3 is a schematic diagram of an exemplary clamp level adjustment circuit (300) that is arranged in accordance with the present invention. Clamp level adjustment circuit 300 includes p-type transistors P30–P33, and n-type transistors N30–N33. Clamp level adjustment circuit 300 is arranged to reduce the slewing time of the charge-pump circuit that is shown in FIG. 2.

Transistor P30 includes a source that is coupled to VHI, a gate that is coupled to bias signal PB, and a drain that is coupled to the source of transistor P31. Transistor P31 includes a gate that is coupled to bias signal NBC, and a drain that is coupled to VLO. Transistor N30 includes a source that is coupled to the drain of transistor N31, a gate that is coupled to the source of transistor P31, and a drain that is coupled to VHI. Transistor N31 includes a gate that is coupled to bias signal NB, and a source that is coupled to VLO. Transistor N32 includes a source that is coupled to the drain of transistor N33, a gate that is coupled to bias signal PBC, and a drain that is coupled to VHI. Transistor N33 includes a source that is coupled to VLO, and a gate that is coupled to bias signal NB. Transistor P32 includes a source that is coupled to VHI, a gate that is coupled to bias signal PB, and a drain that is coupled to the source of transistor P33. Transistor P33 includes a gate that is coupled to the source of transistor N32, and a drain that is coupled to VLO.

Transistors P30 and P32 are arranged to operate as current source circuits, while transistors P31 and P33 are each arranged to operate as source followers. Similarly, transistors N31 and N33 are arranged to operate as current sink circuits, while transistors N30 and N32 are arranged to operate as source followers. The source of transistor N30 corresponds to reference signal NREF, while the source of transistor P33 corresponds to reference signal PREF. Analyzing bias circuit 300 reveals that reference signal NREF is determined by (NBC+|VTP31|−TN30). Similarly, reference signal PREF is determined by (PBC−VTN32+|VTP33|). VTN30, VTP31, VTN32, and VTP33 correspond to the threshold voltages associated with transistors N30, P31, N32, and P33, respectively. NREF will be approximately the same as NBC, while PREF will be approximately the same as PBC.

Reviewing charge-pump circuit 200 (see FIG. 2) reveals that each current source/sink circuit (210) is configured to minimize the voltage variation on the cascode transistors in the when the current source/sink circuits are deactivated. For example, transistor PCAS0 has a source voltage that is clamped by PREF to approximately PBC when the current source circuit is deactivated. Since the gate-source voltage of cascode transistor PCAS0 is effectively zero, source voltage associated with cascode transistor PCAS0 is only required to change by roughly a single p-threshold for activation. Similarly, transistor NCAS0 has a source voltage that is clamped by NREF to approximately NBC when the current sink circuit is deactivated. Since the gate-source voltage of cascode transistor NCAS0 is effectively zero, the source voltage associated with cascode transistor NCAS0 is only required to change by roughly a single n-threshold for activation. Thus, the turn-on time associated with the cascode transistors is minimized.

Exemplary Bias Circuit

FIG. 4 is a schematic diagram of an exemplary bias circuit (400) that is arranged in accordance with the present invention. Bias circuit 200 includes transistors M401–M421, and switches SW41–SW42. Bias circuit 400 is used by charge-pump circuit 200, which is shown in FIG. 2.

Transistors M401 includes a drain that is coupled to current source 141, a gate that is coupled to node NBC, and a source that is coupled to a drain of transistor M402. Transistor M402 includes a gate that is coupled to node NBC, and a source that is coupled to a drain of transistor M403. Transistor M403 includes a gate that is coupled to node NBC, and a source that is coupled to a drain of transistor M404. Transistor M404 includes a gate that is coupled to node NBC, and a source that is coupled to a drain of transistor M408. Transistor M408 includes a gate that is coupled to VHI and a source that is coupled to VLO. Transistor M405 includes a drain that is coupled to current source 142 (NB), a gate that is coupled to NBC, and a source that is coupled to the drain of transistor M407. Transistor M407 includes a gate that is coupled to VIU, and a source that is coupled to the drain of transistor M412. Transistor M412 includes a gate that is coupled to current source 142, and a source that is coupled to NB. Transistor M406 includes a drain that is coupled to the drain of transistor M418, a gate that is coupled to NBC, and a source that is coupled to the drain of transistor M410. Transistor M410 includes a gate that is coupled to VHI, and a source that is coupled to the drain of transistor M413. Transistor M413 includes a gate that is coupled to NB, and a source that is coupled to VLO. Transistor M407 includes a drain that is coupled to PB, a gate that is coupled to NBC, and a source that is coupled to the drain of transistor M411. Transistor M411 includes a gate that is coupled to VIU, and a source that is coupled to the drain of transistor M414. Transistor M414 includes a gate that is coupled to NB, and a source that is coupled to VLO. Transistor M415 includes a drain that is coupled to the source of transistor M416, a gate that is coupled to VLO, and a source that is coupled to VHI. Transistor M416 includes a drain that is coupled to the drain of transistor M417, and a gate that is coupled to PBC. Transistor M417 includes a drain that is coupled to the drain of transistor M418, and a gate that is coupled to PBC. Transistor M418 includes a gate that is coupled to PBC. Transistor M419 includes a drain that is coupled to the source of transistor M420, a gate that is coupled to PB, and a source that is coupled to VHI. Transistor M420 includes a drain that is coupled to the source of transistor M421, and a gate that is coupled to VLO. Transistor M421 includes a drain that is coupled to PBC, and a gate that is coupled to PBC.

In active operation, bias circuit 400 provides bias signals PB, PBC, NB, and NBC. During a power-down mode, switches SW41 and SW42 disable the bias circuit. Switch SW41 couples NB to VLO when activated by signal PD. Switch SW42 couples PB to VHI when activated by signal PD. Another bias circuit may be employed without departing from the spirit of the present invention.

Exemplary Charge-pump Decoder Circuit

FIG. 5 is a schematic diagram of an exemplary charge-pump decoder circuit (500) that is arranged in accordance with the present invention. Charge-pump decoder circuit 500 is arranged to selectively activate the charge-pump circuit that is shown in FIG. 2. The circuit arrangement illustrated in FIG. 2 is configured to function according to the following table:

| KD[2..0] | DOWN[0..7] | UP[0..7] |
|---|---|---|
| 000 | 01111111 | 10000000 |
| 001 | 00111111 | 11000000 |
| 010 | 00011111 | 11100000 |
| 011 | 00001111 | 11110000 |
| 100 | 00000111 | 11111000 |
| 101 | 00000011 | 11111100 |
| 110 | 00000001 | 11111110 |
| 111 | 00000000 | 11111111 |

The table identified-above illustrates DOWN[0 . . . 7] and UP[0 . . . 7] signals for the circuit illustrated in FIG. 2 when KD (the program control signal) has three bits of resolution, and when UP and DOWN are both active. Each current source circuit is enabled when a corresponding one of DOWN[0 . . . 7] is logic 0. Each current sink circuit is enabled when a corresponding one of UP[0 . . . 7] is logic 1. When DOWN is logic 0, signals DOWN[0 . . . 7] all correspond to a logic 1 such that all of the current source circuits are disabled. Similarly, when UP is low, signals UP[0 . . . 7] all correspond to logic 0 such that the current sink circuits are all disabled. The inverse signals DOWN[0 . . . 7]B and UP[0 . . . 7]B are not shown in the table, but correspond to an inverse of signals DOWN[0 . . . 7] and UP[0 . . . 7], respectively.

Each successive value of KD (the program control signal) will cause the charge-pump decoder circuit to activate a successive one of the current source circuits when the DOWN input signal (see FIG. 2) is active. Similarly, each successive value of KD (the program control signal) will cause the charge-pump decoder circuit to activate a successive one of the current sink circuits when the UP input signal is active. Since the charge-pump decoder circuit will only permit the UP[0 . . . 7] and DOWN[0 . . . 7] control signals to change when selected, the charge-injection at the common nodes for non-selected current source/sink circuits is eliminated since no switching transients are effected in non-selected circuits.

The circuit illustrated in FIG. 5 is for illustrative purposes. Other circuit arrangements can provide similar functionality to enable and disable the various current source/sink circuits without departing from the spirit of the present invention.

The above specification, examples and data provide a complete description of the manufacture and use of the composition of the invention. Since many embodiments of the invention can be made without departing from the spirit and scope of the invention, the invention resides in the claims hereinafter appended.

I claim:

1. A programmable charge-pump circuit that provides an output signal to an output node in response to UP and DOWN signals, comprising:

a charge-pump decoder circuit that is arranged to provide a first array of control signals in response to the UP signal and a program control signal, and also provide a second array of control signals in response to the DOWN signal and the program control signal, wherein the program control signal determines which of the first and second array of control signals are selected in response to the UP and DOWN signals, respectively, such that the non-selected control signals from the first and second arrays are maintained at a constant logic level;

an array of selectable current sources, wherein each of the selectable current sources includes a current source circuit that is selectively series coupled to a corresponding cascode circuit when activated in response to a corresponding DOWN control signal from the first array of control signals, wherein each cascode circuit is biased to operate as a cascode for a respective one of the current source circuits such that each selected current source circuit provides a source current that flows from the current source circuit to the output node through the cascode circuit; and an array of selectable current sinks, wherein each of the selectable current sinks includes a current sink circuit that is selectively series coupled to another corresponding cascode circuit when activated in response to a corresponding UP control signal from the second array of control signals, wherein each other cascode circuit is biased to operate as a cascode for a respective one of the current sink circuits such that each selected current sink circuit provides a sinking current that flows from the output node to the current sink circuit through the other cascode circuit, whereby charge feed-through to the output node is minimized by maintaining constant logic levels on the control signals for the non-selected current source and sink circuits.

2. A programmable charge-pump circuit that provides an output signal to an output node in response to UP and DOWN signal, comprising:
   a charge-pump decoder circuit that is arranged to provide a first array of control signals in response to the UP signal and a program control signal, and provide a second array of control signals in response to the DOWN signal and the program control signal, wherein the program control signal determines which of the first and second array of control signals are selected in response to the UP and DOWN signals, respectively, such that the non-selected control signals from the first and second arrays are maintained at a constant logic level;
   an array of selectable current sources, wherein each of the selectable current sources includes a current source circuit that is selectively coupled to the output node through a corresponding cascode circuit when activated in response to a corresponding DOWN control signal from the second array of control signals;
   an array of selectable current sinks, wherein each of the selectable current sinks includes a current sink circuit that is selectively coupled to the output node through another corresponding cascode circuit when activated in response to a corresponding UP control signal from the first array of control signals, whereby charge feed-through to the output node is minimized by maintaining constant logic levels on the control signals for the non-selected current source and sink circuits; and
   a clamp level adjustment circuit that provides a PREF signal to the array of selectable current source circuits, wherein each of the selectable current source circuits is configured to clamp a common node between the current source circuit and the corresponding cascode circuit to the PREF signal when an inverse of the corresponding DOWN control signal from the second array of control signals is active.

3. A programmable charge-pump circuit that provide an output signal to an output node in response to UP and DOWN signals, comprising:
   a charge-pump decoder circuit that is arranged to provide a first array of control signals in response to the UP signal and a program control signal, and also provide a second array of control signals in response to the DOWN signal and the program control signal, wherein the program control signal determines which of the first and second array of control signals are selected in response to the UP and DOWN signals, respectively, such that the non-selected control signals from the first and second arrays are maintained at a constant logic level;
   an array of selectable current sources, wherein each of the selectable current sources includes a current source circuit that is selectively coupled to the output node through a corresponding cascode circuit when activated in response to a corresponding DOWN control signal from the second array of control signals;
   an array of selectable current sinks, wherein each of the selectable current sinks includes a current sink circuit that is selectively coupled to the output node through another corresponding cascode circuit when activated in response to a corresponding UP control signal from the first array of control signal, whereby through to the output node is minimized by maintaining constant logic levels on the control signal for the non-selected current source and sink circuits; and
   a clamp level adjustment circuit that provides an NREF signal to the array of selectable current sink circuits, wherein each of the selectable current source circuits is configured to clamp a common node between the current sink circuit and the corresponding cascode circuit to the NREF signal when an inverse of the corresponding UP control signal from the first array of control signals is active.

4. A programmable charge-pump circuit that provides an output signal to an output node in response to UP and DOWN signals, comprising;
   a charge-pump decoder circuit that is arranged to provide a first array of control signals in response to the UP signal and a program control signal, and also provide a second array of control signals in response to the DOWN signal and the program control signal, wherein the program control signal determines which of the first and second array of control signals are selected it response to the UP and DOWN signals, respectively, such that the non-selected control signal from the first and second arrays am maintained at a constant logic level;
   an array of selectable current sources, wherein each of the selectable current sources includes a current source circuit that is selectively coupled to the output node through a corresponding cascode circuit when activated in response to a corresponding DOWN control signal from the second array of control signals; and
   an array of selectable current sinks, wherein each of the selectable current sinks includes a current sink circuit that is selectively coupled to the output node through another corresponding cascode circuit when activated in response to a corresponding UP control signal from the first array of control signals, whereby charge feed-through to the output node is minimized by maintaining constant logic levels on the control signals for non-selected current source and sink circuits, wherein each selectable current source includes a first transistor that is biased by a PB bias signal, a second transistor that is biased by a PBC bias signal and coupled to the output node, and a third transistor that is configured to couple the drain of the first transistor to the source of the second transistor when activated in response to the corresponding DOWN control signal such that the first transistor is isolated from the output node by the second transistor when the third transistor is active.

5. The programmable charge pump circuit of claim 4, further comprising a first capacitor that is coupled to the PB bias signal, and a second capacitor that is coupled to the PBC bias signal, wherein the first and second capacitors are configured to decouple the respective bias lines such that charge injection to the output node is minimized.

6. The programmable charge-pump circuit of claim 4, wherein each selectable current source further includes a fourth transistor that is coupled to a common point between the second transistor and the third transistor, wherein the fourth transistor is activated by an inverse of the corresponding DOWN control signal, and wherein the third and fourth transistors are matched such that charge injection from the parasitic capacitances of the third and fourth transistors to the common point is minimized.

7. The programmable charge-pump circuit of claim 6, wherein the fourth transistor of each selectable current source is configured to couple a PREF signal to the common point when activated in response to the inverse of the corresponding DOWN control signal, such that the common point is clamped to the PREF signal when the fourth transistor is activated.

8. The programmable charge-pump circuit of claim 7, wherein the PREF signal is substantially equivalent to the PBC signal.

9. A programmable charge-pump circuit that provides an output signal to an output node in response to UP and DOWN signals, comprising:
- a charge-pump decoder circuit that is arranged to provide a first array of control signals in response to the UP signal in response to the DOWN signal and the program control signal, wherein the program control signal determines which of the first and second array of control signals are selected in response to the UP and DOWN signals, respectively, such that the non-selected control signal from the first and second arrays are maintained at a constant logic level;
- an array of selectable current sources, wherein each of the selectable current sources includes a current source circuit that is selectively coupled to the output node through a corresponding cascode circuit when activated in response to a corresponding DOWN control signal from the second array of control signals; and
- an array of selectable current sinks, wherein each of the selectable current sinks includes a current sink circuit that is selectively coupled to the output node through another corresponding cascode circuit when activated in response to a corresponding UP control signal from the first array of control signals, whereby charge feed-through to the output node is minimized by maintaining constant logic levels on the control signals for the non-selected current source and sink circuits, wherein each selectable current sink includes a first transistor that is biased by an NB bias signal, a second transistor that is biased by an NBC bias signal and coupled to the output node, and a third transistor that is configured to couple the drain of the first transistor to the source of the second transistor when activated in response to the corresponding UP control signal such that the first transistor is isolated from the output node by the second transistor when the third transistor is active.

10. The programmable charge-pump circuit of claim 9, further comprising a first capacitor that is coupled to the NB bias signal, and a second capacitor that is coupled to the NBC bias signal, wherein the first and second capacitor circuits are configured to decouple the respective bias lines such that charge injection to the output node is minimized.

11. The programmable charge-pump circuit of claim 9, wherein each selectable current source further includes a fourth transistor that is coupled to a common point between the second transistor and the third transistor, wherein the fourth transistor is activated by an inverse of the corresponding UP control signal, and wherein the third and fourth transistors are matched such that charge injection from the parasitic capacitances of the third and fourth transistors to the common point is minimized.

12. The programmable charge-pump circuit of claim 11, wherein the fourth transistor of each selectable current source is configured to couple an NREF signal to the common point when activated in response to the inverse of the corresponding UP control signal, such that the common point is clamped to the NREF signal when the fourth transistor is activated.

13. The programmable charge-pump circuit of claim 12, wherein the NREF signal is substantially equivalent to the NBC signal.

14. A phase-locked-loop system, comprising:
- a phase-detector circuit that provides an UP signal and a DOWN signal by comparing an input signal phase to a clock signal phase;
- a charge-pump decoder circuit that is arranged to provide a first array of control signals in response to the UP signal and a program control signal and also provide a second array of control signals in response to the DOWN signal and the program control signal, wherein the program control signal determines which of the first and second array of control signals are selected in response to the UP and DOWN signals, respectively, such that the non-selected control signals from the first and second arrays are maintained at a constant logic level;
- an array of selectable current sources, wherein each of the selectable current sources includes a current source circuit that is selectively coupled to the output node through a corresponding cascode circuit when activated in response to a corresponding DOWN control signal from the second array of control signals;
- an array of selectable current sinks, wherein each of the selectable current sinks includes a current sink circuit that is selectively coupled to the output node through another corresponding cascode circuit when activated in response to a corresponding UP control signal from the first array of control signals, whereby charge feed-through to the output node is minimized by maintaining constant logic levels on the control signals for the non-selected current source and sink circuits;
- a loop filter circuit that is coupled to the output node, wherein the loop filter is arranged to integrate current that is provided to the output node;
- a current-controlled oscillator circuit that is coupled to an output of the loop filter circuit; and
- a counter circuit that is coupled to an output of the current-controlled oscillator circuit, and configured to provide the clock signal.

15. A programmable charge-pump circuit that provides an output signal to an output node in response to an UP signal, a DOWN signal, and a program signal, the programmable charge-pump circuit comprising:
- a means for decoding that is responsive to the program control signal, the UP signal, and the DOWN signal, wherein the means for decoding is arranged to provide a first array of control signals in response to the UP signal and the program control signal, and also provide a second army of control signals in response to the DOWN signal and the program control signal, wherein the program control signal determines which of the first and second array of control signals are selected in response to the UP and DOWN signals, respectively, such that the non-selected control signals from the first and second arrays are maintained at constant logic levels;
- a first means for sourcing current that is arranged to provide a first source current when active;
- a first means for enabling that is arranged to selectively activate the first means for sourcing current in response to a corresponding one of the second array of control signals;
- a first means for cascoding that is arranged to cascode the means for sourcing current when the first means for enabling activates the means for sourcing wherein the first means for cascoding is further arranged to provide the first source current to the output node when active;
- a first means for disabling that is arranged to deactivate the first means for cascoding in response to an inverse of the corresponding one of the second array of control signals;

a second means for sourcing current that is arranged to provide a second source current when active;

a second means for enabling that is arranged to selectively activate the second means for sourcing current in response to a corresponding one of the first array of control signals;

a second means for cascoding that is arranged to cascode the second means for sourcing current when the second means for enabling activates the second means for sourcing, wherein the second means for cascoding is further arranged to drain the second source current from the output node when active; and a second means for disabling that is arranged to deactivate the second means for cascoding in response to an inverse of the corresponding one of the first array of control signals.

16. A programmable charge-pump circuit that provides an output signal to an output node in response to UP and DOWN signals, comprising:

a charge-pump decoder circuit that is arranged to provide a first array of control signals in response to the UP signal and a program control signal, and also provide a second array of control signals in response to the DOWN signal and the program control signal, wherein the program control signal determines which of the first and second array of control signals are selected in response to the UP and DOWN signals, respectively, such that the non-selected control signals from the fist and second arrays are maintained at a constant logic level;

an array of selectable current sources, wherein each of the selectable current sources includes a current source circuit that is selectively series coupled to a corresponding cascode circuit through a corresponding switch, wherein each corresponding switch is activated in response to a corresponding DOWN control signal from the second array of control signals wherein each cascode circuit is biased to operate as a cascode for a receive one of the current source circuits such that each selected current source circuit provides a source current that flows from the current source circuit to the output node through the cascode circuit and the corresponding switch; and an array of selectable current sinks, wherein each of the selectable current sinks includes a current sink circuit that is selectively series coupled to another corresponding cascode circuit through a corresponding switch, wherein each corresponding switch is activated in response to a corresponding UP control signal from the first array of control signals, wherein each other cascode circuit is biased to operate as a cascode for a respective one of the current sink circuits such that each selected current sink circuit provides a sinking current that flows from the output node to the current sink circuit through the other cascode circuit and the corresponding switch, whereby charge feed-through to the output node is minimize by maintaining constant logic levels on the control signals for the non-selected current source and sink circuits.

* * * * *